United States Patent [19]
Vinci

[11] Patent Number: 5,672,964
[45] Date of Patent: Sep. 30, 1997

[54] VOLTAGE PROBE TESTING DEVICE

[76] Inventor: Peter Vinci, 1695 Kirkwood Pike, Kirkwood, Pa. 17603

[21] Appl. No.: 608,997

[22] Filed: Nov. 13, 1995

Related U.S. Application Data

[63] Continuation of Ser. No. 42,286, Apr. 2, 1993, abandoned.

[51] Int. Cl.$^6$ .................... G01R 31/02; G01R 19/145
[52] U.S. Cl. .................... 324/72.5; 324/556; 324/133; 324/149
[58] Field of Search ............................. 324/503, 543, 324/555, 556, 66, 72, 72.5, 133, 149, 754; 340/635; 362/119

[56] References Cited

U.S. PATENT DOCUMENTS

| | | | |
|---|---|---|---|
| 1,639,889 | 8/1927 | Humm | 324/556 X |
| 2,509,653 | 5/1950 | Show | 324/72.5 |
| 3,689,832 | 9/1972 | Leto et al. | 324/149 X |
| 3,806,803 | 4/1974 | Hall | 324/72.5 X |
| 3,962,630 | 6/1976 | Chaffee | 324/149 X |
| 4,015,201 | 3/1977 | Chaffee | 324/149 X |
| 4,028,621 | 6/1977 | Bloxam | 324/503 X |
| 4,356,442 | 10/1982 | Beha | 324/149 X |
| 4,673,868 | 6/1987 | Jones, Jr. | 324/149 X |
| 4,731,586 | 3/1988 | Perkins | 324/556 X |
| 4,999,574 | 3/1991 | Stephens | 324/556 X |

OTHER PUBLICATIONS

Radio Shack 1993 Catalog, p. 131, "Rechargeable Soldering Gun". (Month unaviable).

*Primary Examiner*—Vinh P. Nguyen
*Assistant Examiner*—Diep Do
*Attorney, Agent, or Firm*—Michael, Best & Friedrich

[57] ABSTRACT

An ergonomically designed pistol grip voltage probe testing device features visual output indicators, such an LED light, as well as at least one additional or auxiliary indicator such as a buzzer. The LED advantageously changes colors depending on the potential applied to the probe conductor. Other auxiliary output feedback devices are disclosed. The device is particularly suitable for use in an automotive environment, and, in one embodiment, includes a cigarette plug adapter for connecting the device to a cigarette lighter receptacle for supplying output power and a ground reference potential to the test device.

15 Claims, 10 Drawing Sheets

VOLTAGE PROBE TESTING DEVICE

This is a continuation of application Ser. No. 08/042,286, filed Apr. 2, 1993, now abandoned.

BACKGROUND OF THE INVENTION

The invention generally relates to circuit testing devices, and more particularly, to an improved probe that enables the user to easily detect the existence of an electrical potential, particularly when tracing electrical circuits or components in motor vehicles.

As anyone who has ever worked on the electrical system of an automobile will readily attest, the task of tracing a conductor in a multi-conductor harness, such as in an automobile, is a difficult and time consuming one. Various testing devices have been proposed to facilitate this task.

In U.S. Pat. No. 4,673,868 to Jones, Jr., there is disclosed a method of testing electronic automotive parts. The apparatus includes probes, a battery, conductors and contacts, a buzzer and an incandescent electric lamp all generally connected in series. The patent suggests the use of a wide variety of indicators, including electro-acoustic and electro-visual transducers. However, the patent does not disclose the configuration of the testing device. The electrical lamp serves as a current detector by lighting up when current is passing through the circuit and, therefore, provides a visual indication when a pre-selected voltage is detected by the testing device.

U.S. Pat. No. 4,015,201 to Chaffee discloses an electrical continuity and voltage testing device. This device includes a housing, a first probe, which projects from the housing, a second probe connected to the housing by a flexible cable and a voltage meter mounted on the housing. Indicator lights as well as a speaker or buzzer serve as indicators for different voltage levels and are provided on the front surface of the housing. This patent teaches the generation of an audio sound when a predetermined potential is applied to the first probe. Both probes are used for continuity testing. The unit is shaped as a generally rectangular housing and similar in configuration to a hand-held cellular telephone unit. A similar electric circuit voltage and continuity testing device is disclosed in U.S. Pat. No. 4,152,639 also issued to Chaffee.

In Koslar U.S. Pat. No. 4,527,118 there is disclosed a testing device for indicating an electric voltage and its polarity and for continuity testing. This patent includes two separate test probes connected to each other by a cable. Each test probe includes a test prod or pointed probe element. However, this testing device contains visual indicators to indicate numerous ranges of staggered or stepped voltage levels. While its complex construction and, undoubtedly, its high cost, may be justified for certain electronic applications, the testing device is not designed for use in a vehicle environment, particularly under the dashboard, since the use of the device requires that both hands be used for holding each of the separate handles. Because the device has its own built-in voltage source, it cannot be tied directly into the electrical system on an automobile and, for that reason as well, the use of the device for tracing electrical continuity in an automobile renders the device almost useless.

An electrical probe designed for use in an automotive environment is disclosed in U.S. Pat. No. 5,057,770 issued to Kalishman. The hand-held probe device is adapted for use in testing the existence and magnitude of an electrical potential in an automobile. The device has a housing from which there extends a probe and a ground lead at the other end which terminates in a clip. The housing also includes a volt meter and an electric bulb connected in parallel between the probe and the ground lead. The housing includes a switch which enables the device to be operated while held in one hand.

An electronic voltage and continuity testing unit is disclosed in U.S. Pat. No. 4,356,442 to Beha. The unit includes probes and a glow lamp connected between the probes, a loudspeaker driven by an oscillator and a power source. The level of voltage is indicated by the intensity of the glow lamp. The testing unit in this patent is disclosed to be generally in the shape of a "pencil" probe which is a common shape or configuration for portable test probes.

In U.S. Pat. No. 3,962,630 issued to Chaffee, an electrical continuity and voltage testing device includes two probes, light indicators, a speaker and a battery. The reference discloses that when the probes are applied to a continuous circuit, the speaker emits a sound; when the probes are applied to a source of 110 AC voltage, the speaker emits a sound and the lights dimly glow; and when the probes are applied to a source of 220 AC volts, the sound is much louder and the lights grow more brightly.

A resistance tester for producing an audible tone that varies with the resistance is disclosed in U.S. Pat. No. 3,689,832 to Leto et al. The tester, which falls in the "pencil"-type or configuration includes a tubular housing having a pin chuck fitted at one end and a probe placed in the pin chuck. The tester includes a speaker that emits a tone whose pitch is dependent on the resistance being tested.

As will be noted, therefore, numerous probe or testers have been proposed, some of which are primarily intended for testing electronic circuits but some of which have been designed for use in the automotive environment. However, none of the testers are ergonomically designed to facilitate the secure gripping of the probe. Additionally, none of the probes include a light which illuminates the work area in the region of the probe test point. Additionally, none of the known electrical testing devices include power leads which terminate in a cigarette lighter adaptor that can be inserted directly into a cigarette lighter receptacle of an automobile to power the unit.

SUMMARY OF THE INVENTION

Accordingly, it is an object of the present invention to provide a voltage probe testing device that does not include the disadvantages inherent in the known testing devices.

It is another object of the present invention to provide a voltage probe testing light that is simple in construction and economical to manufacture.

It is still another object of the present invention to provide a voltage probe testing device that is ergonomically designed and small enough to fit in the palm of a user.

It is yet another object of the present invention to provide a voltage probe testing device as suggested in the previous objects that includes a sound generating device, a light indicating device, or both, to provide an indication or feedback to the user when at least one predetermined voltage level is sensed by the probe.

It is a further object of the present invention to provide a voltage probe testing device suggested in the previous objects that is rendered particularly suitable in an automotive environment by connection to a cigarette lighter adaptor to provide power and a ground reference to the device.

It is still a further object of the present invention to provide a voltage probe testing device that includes its own

3 source of illumination for illuminating the work area in which the probe is being used.

It is yet a further object of the present invention to provide a voltage probe testing device that can be rendered compatible with existing automotive testing accessories.

It is an additional object of the present invention to provide a voltage probe testing device that is computer safe and can be used to test micro-processor-based circuits in automobiles.

In order to achieve the above objects, as well as others which will become apparent hereafter, a voltage probe testing device in accordance with the present invention comprises a portable housing. An elongate test probe generally defining a probe axis is provided which has an insulation penetrating test point at one end thereof and has another end thereof mounted on said housing so that said test point projects externally of said housing. Circuit means are provided in said housing connected to said test probe for sensing voltages applied to said test probe and for providing at least one output signal upon sensing of at least one predetermined voltage level on said test probe. Indicator means provides at least one indication corresponding to each predetermined voltage and associated output signal. Said housing is generally in the shape of a pistol grip that can be held in the palm of a user and generally defines a grip axis. Said test probe is mounted and oriented at one end of said housing to point in a direction generally away from the user when normally gripped.

In accordance with another aspect of the invention, light generating means is provided in housing for illuminating the region of the test probe when the device is in use.

Advantageously, the circuit means includes input power line means which includes an automobile cigarette lighter adaptor for providing an electrical power to said circuit means from an automobile battery when the test device is used in an automobile.

BRIEF DESCRIPTION OF THE DRAWINGS

The above and other objects and advantages of the invention will be understood more fully from the following detailed description thereof with reference to the accompanying drawings, in which.

4

Figure 1:
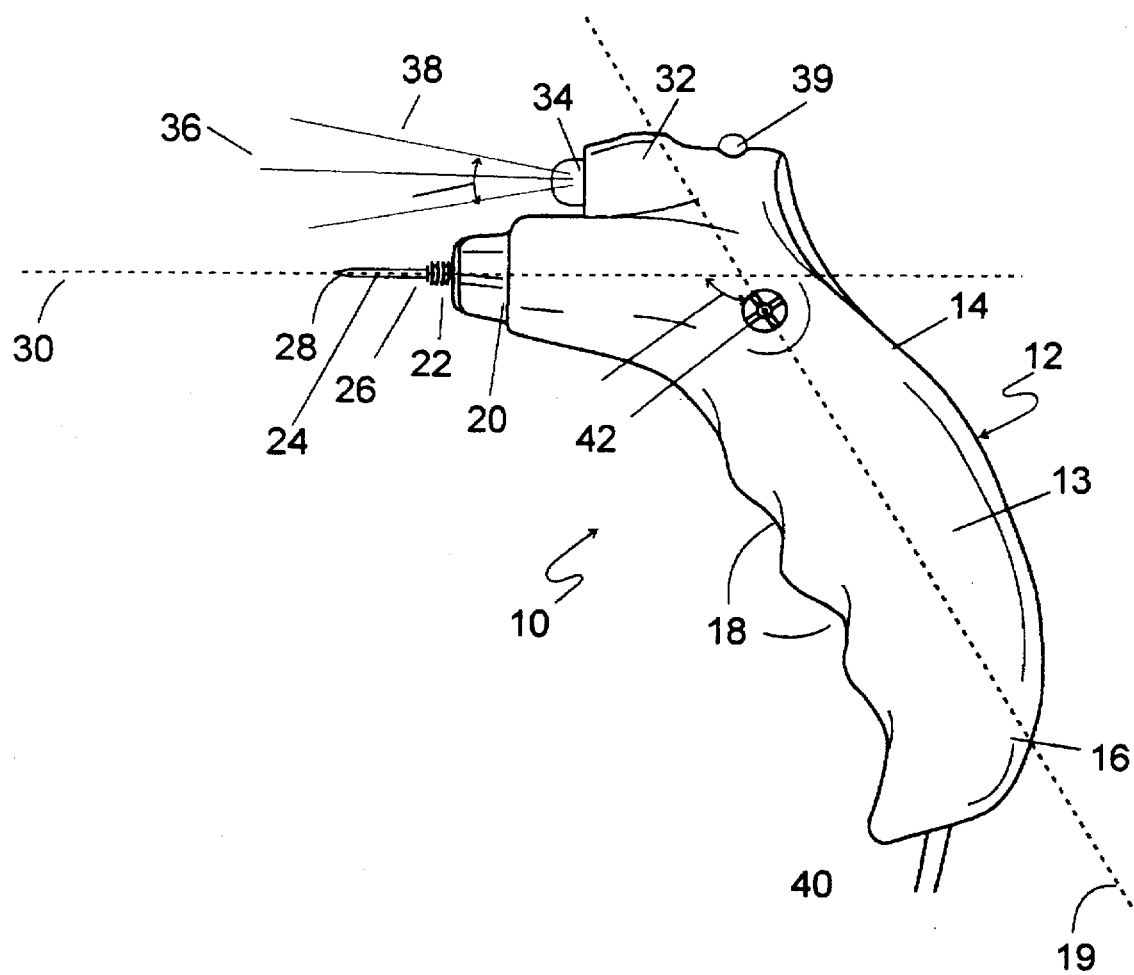
FIG. 1 is a side elevational view of the voltage probe testing device in accordance with the present invention.
Figure 7:
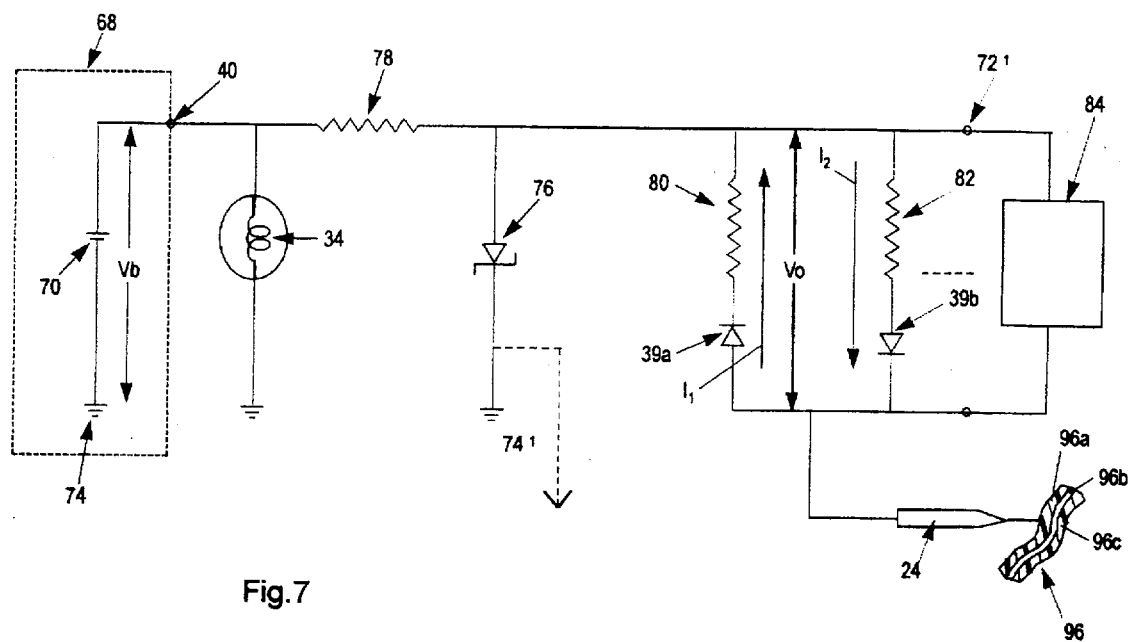
FIG. 7 is a schematic diagram of an electric circuit that may be used in the voltage probe testing device for providing visual as well as auditory feedback upon detection of a "hot" voltage level or a ground potential on a conductor being tested.
Figure 8:
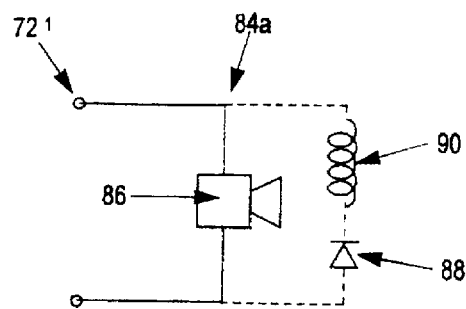
FIG. 8 illustrates one possible embodiment of a sound producing device that can be used in the circuit of FIG. 7.
Figure 9:
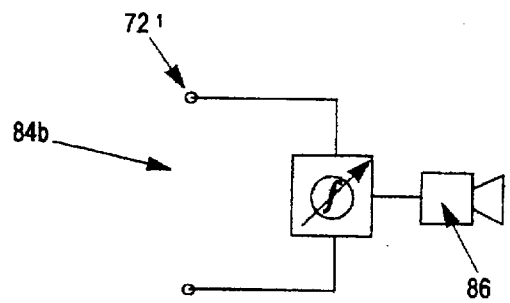
Figure 10:
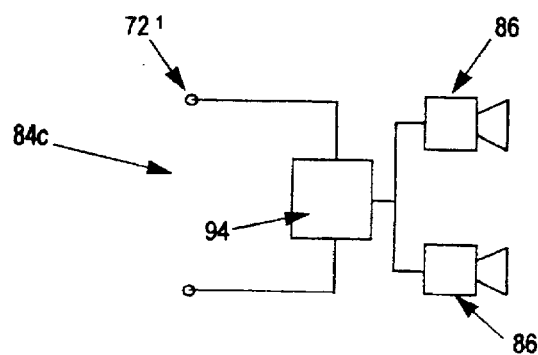
Figure 11:
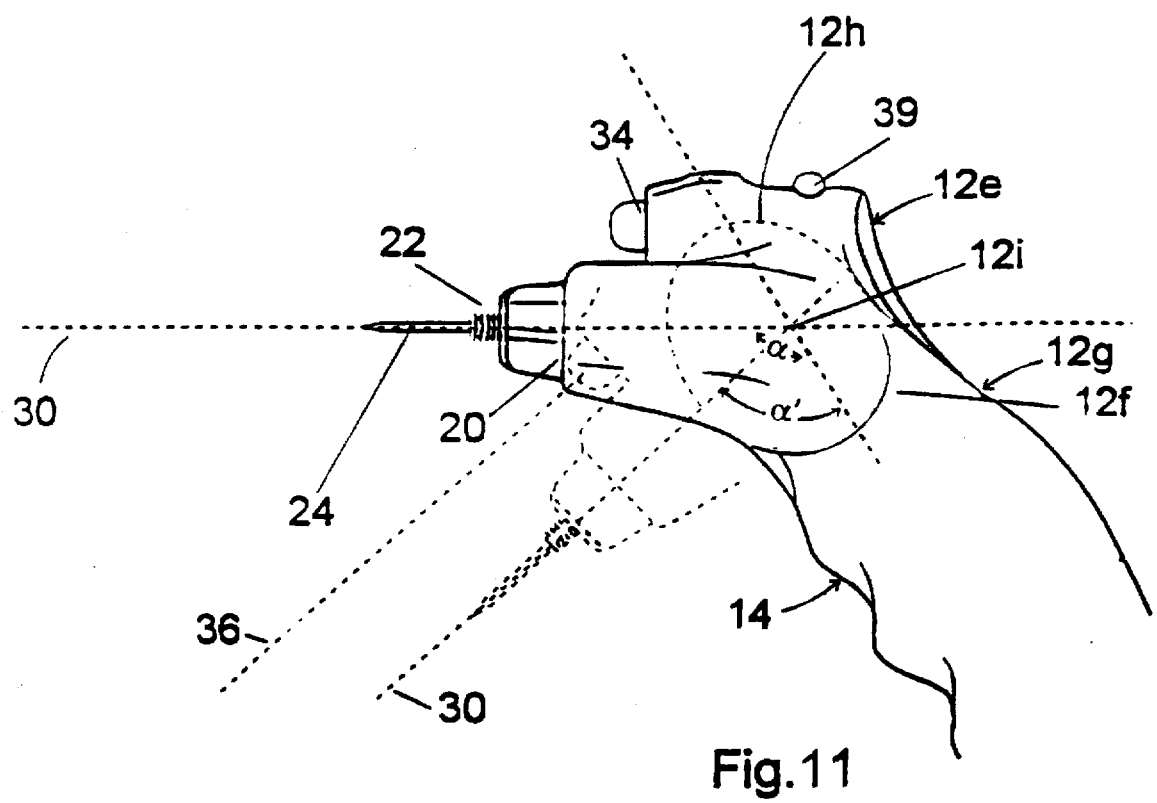
Figure 12:
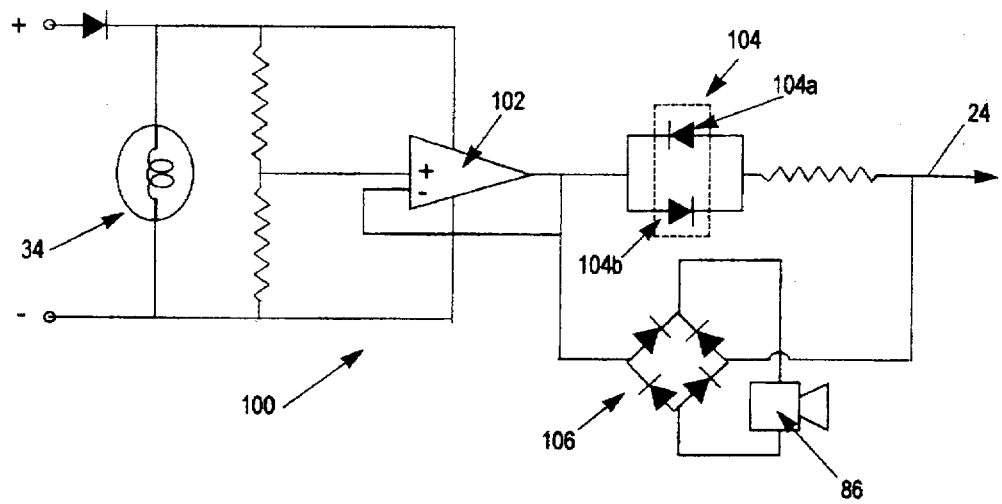
Figure 13:
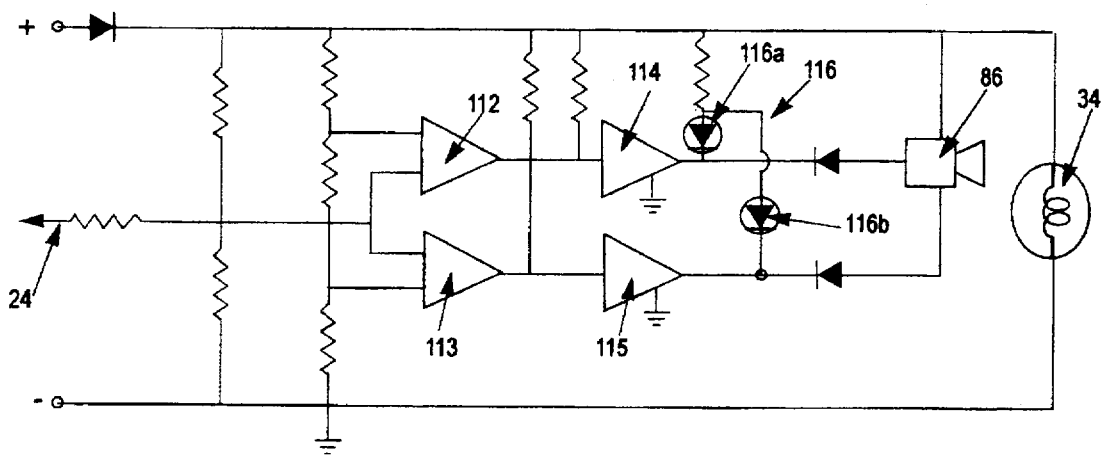

FIG. 9 illustrates another embodiment of a sound producing device that can be used in the circuit of FIG. 8;

FIG. 10 illustrates still another embodiment of a sound producing device that can be used in the circuit of FIG. 8;

FIG. 11 is a fragmented view of the upper portion of the testing device shown in FIG. 1, showing a modification that enables the upper end portion, test probe, and lamp to pivot relative to the hand gripped main body portion;

FIG. 12 is a schematic diagram of another electric circuit that may be used in lieu of the circuit shown in FIG. 7; and FIG. 13 is a schematic diagram of still another electric circuit that can be used in the voltage probe testing device.

DESCRIPTION OF THE PREFERRED EMBODIMENT

Figure 2:
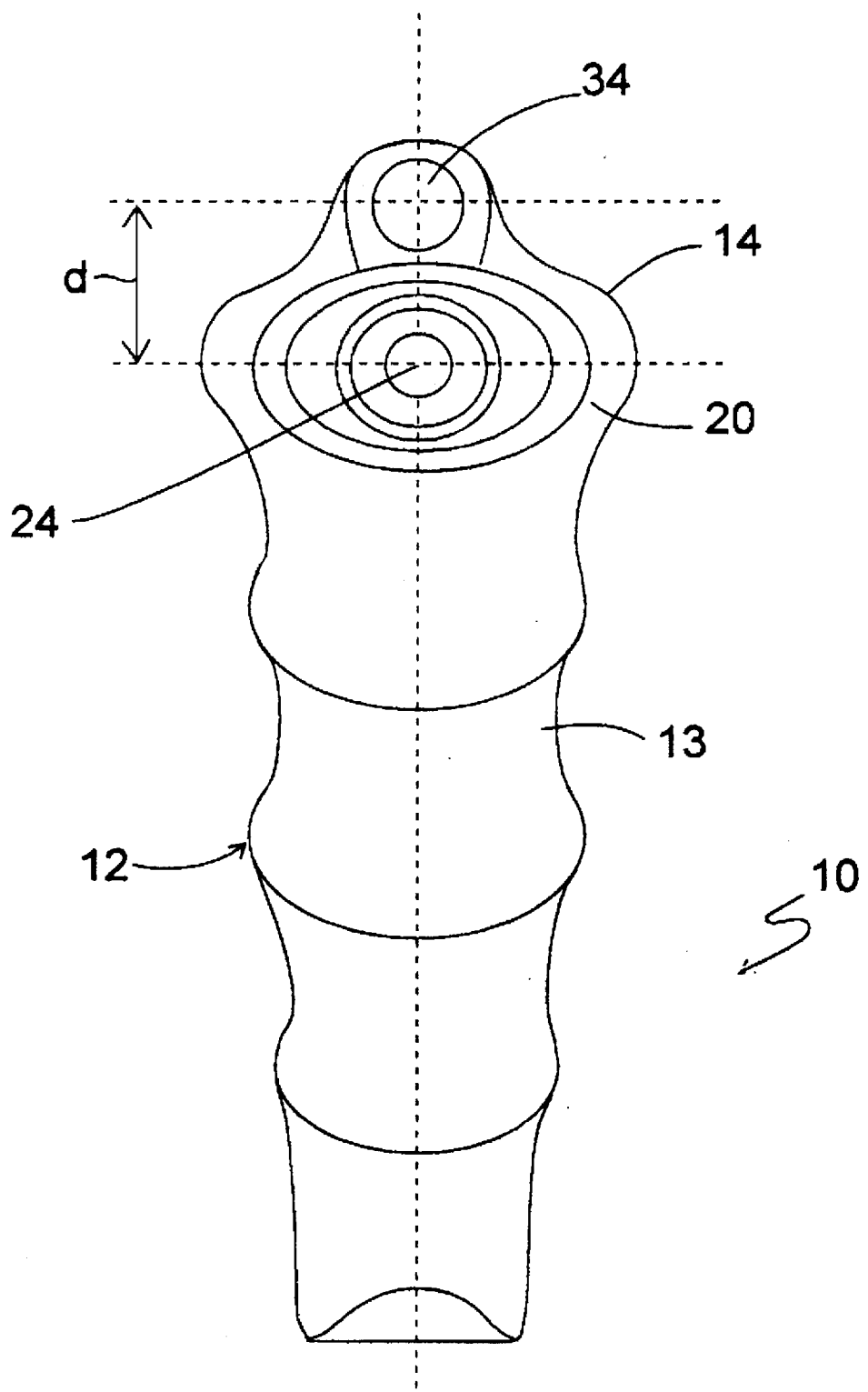
FIG. 2 is a front elevational view of the voltage probe testing device shown in FIG. 1.

Referring now specifically to the drawings, in which identical or similar parts are designated by the same reference numerals throughout, and first referring to FIGS. 1 and 2, a voltage probe testing device in accordance with the present invention is generally designated by the reference numeral 10.

The device 10 includes a generally elongate intermediate portion 13 which is dimensioned and configurated in the shape of a pistol grip that can be held in the palm of the user's hand. The grip portion 13 has an upper end 14 and a lower end 16 as viewed in FIGS. 1 and 2. The intermediate grip portion 13 is generally smooth and straight along the rear thereof while it is provided with 4 depressions, indentations or recesses 18 along the front longitudinal length thereof dimensioned and configurated to receive the fingers of the user when curled about the intermediate gripping portion 13. The housing 12 generally defines a gripping axis 19.

Provided at the upper end 14 is a probe support portion 20 of the housing 12 which, as will be more fully described in connection with FIGS. 3–6, includes means for mounting an internally threaded socket 22 adapted to interchangeably receive an elongate test probe, needle 24 or other accessory (e.g. prods, probes, clips or other items normally used for testing) provided at one end with external threads 26. The test probe 24 is tapered as shown to end in a test probe point or tip 28 which is suitable for penetrating insulation of an insulated conductor and for making contact with an internal conductor. Therefore, while a portion of the test probe 24 is received within the housing support portion 20 and socket 22, the test probe point 28 projects externally of the housing 12 as shown. The test probe 24 is mounted on the housing to point in a direction generally away from the user when the intermediate portion is normally gripped. As best shown in FIG. 1, the probe support portion 20 and test probe 24 define a probe axis 30 that defines an angle a with the gripping axis 19 of the intermediate grip portion 13. The angle α is not critical, but is preferably equal to at least 90°. In the presently preferred embodiment, the angle α is equal to approximately 120° to optimize the comfort while using the device in most applications.

One feature of the invention includes a bulb supporting portion 32 on the housing probe, which is preferably arranged on the opposite side of the intermediate gripping portion 13 in relation to the probe support portion 20. As will be more specifically described in FIGS. 3–6, the bulb support portion 32 houses a light generating means, such as a lamp or bulb 34 that defines an optical axis 36 generally parallel with the probe axis 30, in the disclosed embodiment. The lamp or bulb 34, such as bulb No. 222 (TL-3) or No. 558 (TL-3-1/4), generates a field of illumination 38 for illuminating the region of the test probe 24 when the test probe is in use. If desired, an auxiliary lens may be added to modify the field of illumination. Depending on the type of bulb 34 used, and its associated region or field of illumination, as defined by the angle $\beta$, the optical axis 36 may be modified in relation to the probe axis 30 to insure that the test probe point 28 is within or very close to the region of illumination 38.

Also provided on the bulb support portion 32 for housing 12 is a visual indicator in the form of an LED 39 which, as will be described hereafter, can either be a single color or dual color LED to identify different measured voltage values.

At the lower end 16 of the housing 12 a power line 40 is provided for applying power to the device 10 or, when the device 10 has its own internal power source, the line 40 can be a grounding lead, as will be more fully described in connection with FIG. 7.

A slotted grill 42 is provided on the housing 12 through which audio sounds created within the housing can be projected to the outside of the housing. The specific position of the LED 39 and/or the speaker grill 42 is not critical for purposes of the present invention.

Figure 3:
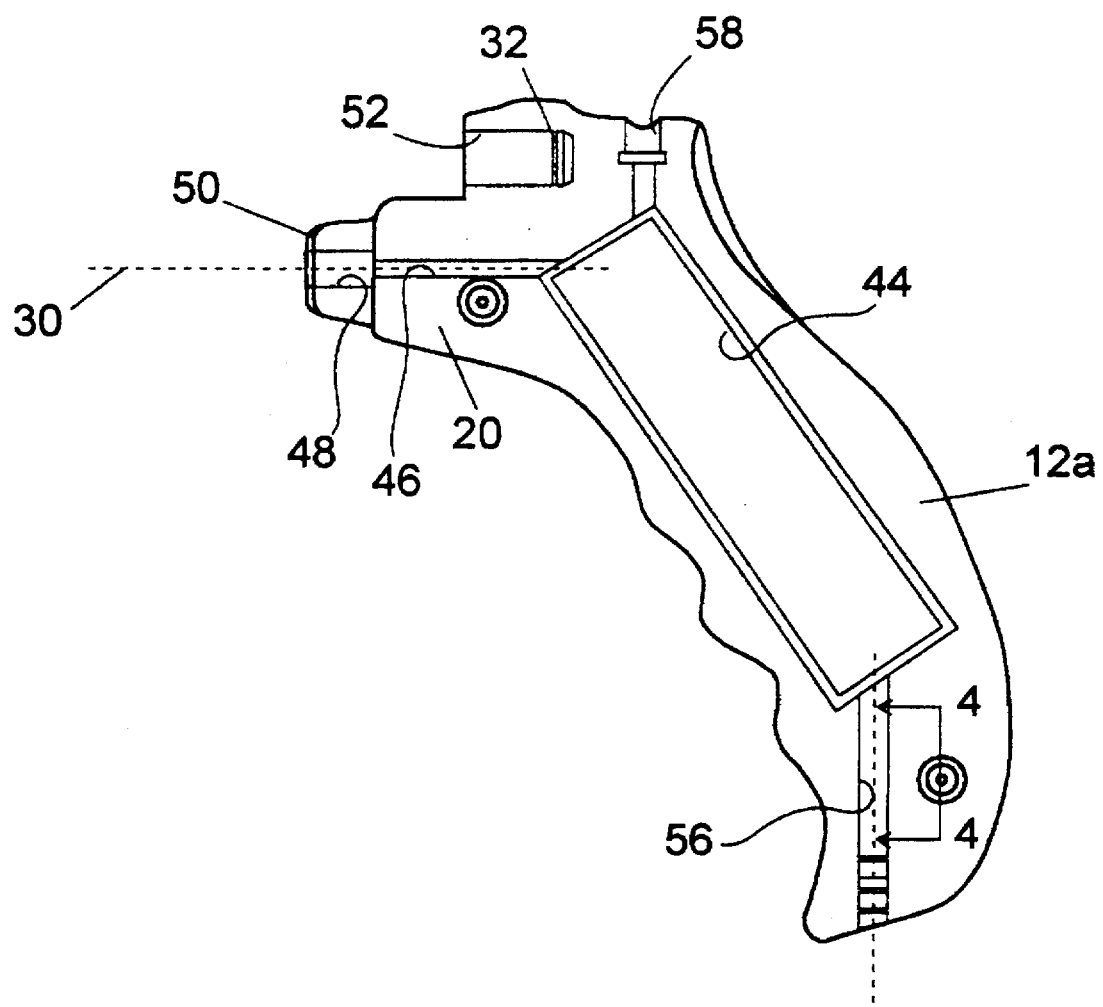
FIG. 3 is similar to FIG. 1, but showing one-half or shell of the molded case which forms part of the housing for the device.

Referring to FIG. 3, one of the complimentary halves of the housing 12, namely portion 12a, is shown, illustrating the internal configuration, it being understood that the other or mating half is provided with similar structure so that when the two halves are connected to each other, they provide the desired internal cavities, recesses or spaces for the components that are mounted in and on the housing. Thus, the housing is provided with a generally rectangular cavity 44 dimensioned to receive a printed circuit board (PCB) on which the electronics, primarily shown in FIG. 7, are mounted. A bore 46 extends from the cavity 44 along the probe support portion 20 through which a conductor can extend to connect the printed circuit board to the test probe 24. A cylindrical cavity 48 is provided in the bulb support portion 20 as shown to receive the internally threaded socket base, or other bulb base 22, which is retained within the support portion 20 by means of inwardly directed annular lip 50. The bulb support portion 52 includes a lamp or bulb socket 32 that is connected by a channel or bore 54 to the cavity 44 so that a conductor can electrically connect the socket 32 to the printed circuit board. If desired, the bulb can be wired directly to the PC board. Similarly, a stepped bore 58 is provided in the support portion 32 for receiving the LED 39, the bore 58 also being in communication with the printed board so that electrical connection can be made therebetween. In the lower end 16, a bore 56 extends from the cavity 44 to the lower free end of the housing to provide for passage of the power line 40 or grounding lead, as the case may be.

Figure 6:
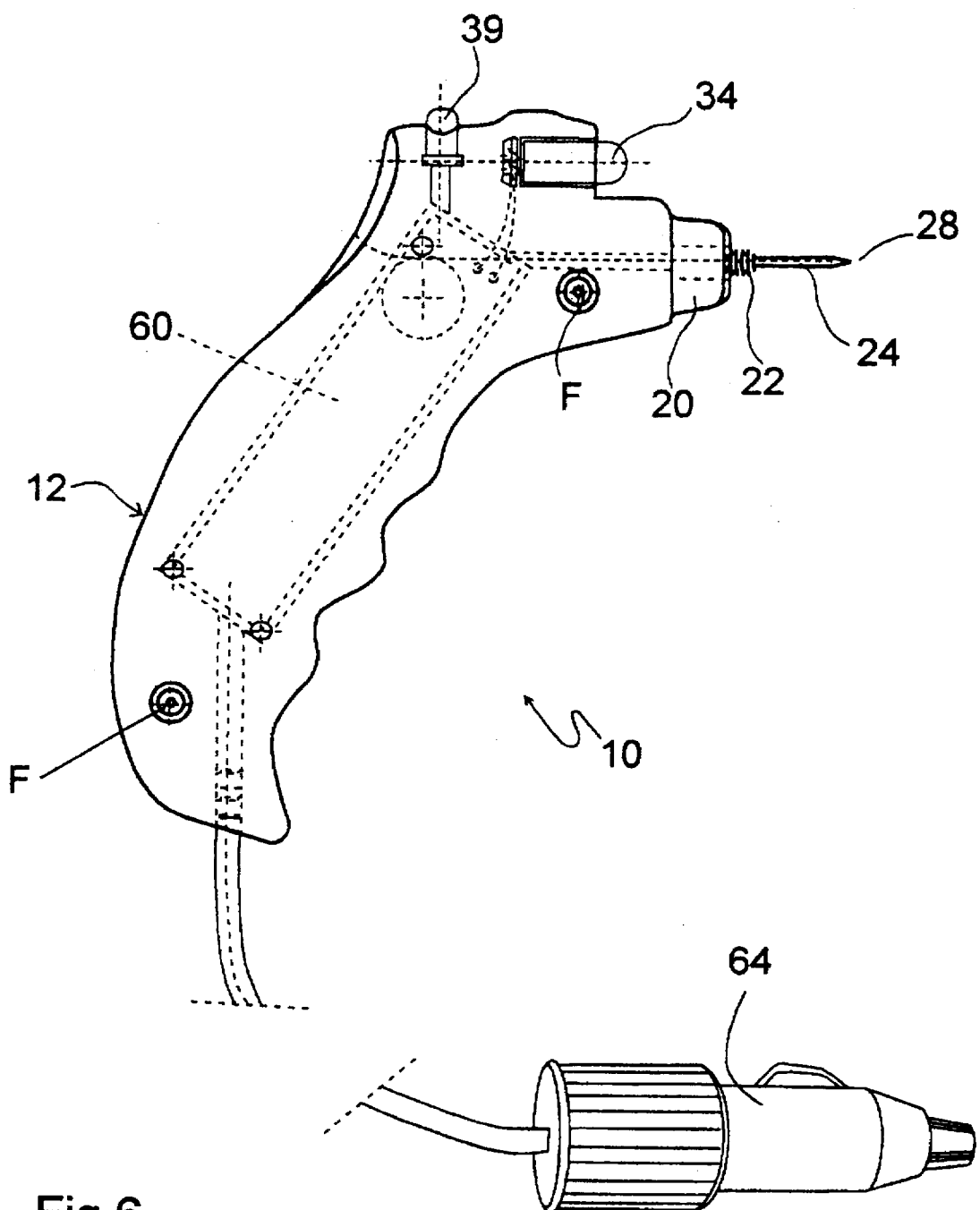
FIG. 6 is similar to FIG. 5, but showing only a single LED and without the printed circuit board although showing the power line connected to a cigarette lighter adaptor.

Referring to FIG. 6, a printed circuit board 60 is shown positioned in the housing, electrical connections being diagrammatically shown between the lamp or bulb 34, the test probe 24 and the power line 40 with the printed circuit board. When a sound generating device is mounted on the printed circuit board, its position on the printed circuit board is preferably such that it is proximate to the speaker grill 42 (FIG. 1) of the housing.

Figure 4:
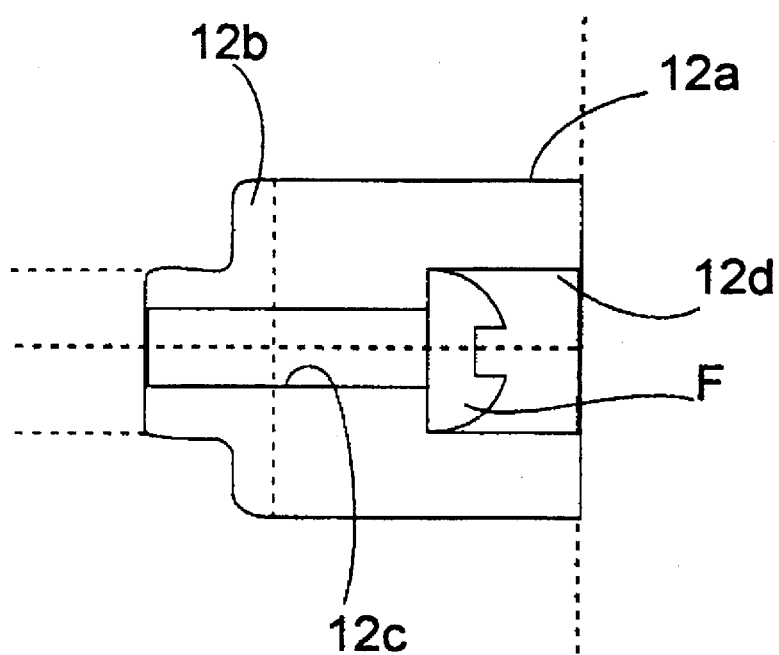
FIG. 4 is a cross-sectional view of a portion of the housing shown in FIG. 3, taken along line 4—4.

Once the printed circuit board 60 and the other electrical components are mounted within or on the housing 12, the complimentary halves or shells can be brought together and secured to each other in any conventional manner. Any suitable fasteners may be used for this purpose. Since the housing is preferably molded, suitable surface shapes or configurations can be provided to conceal or recess fasteners, as suggested in FIG. 4. In FIG. 4, the right half or shell 12a is shown joined to the left shell or half 12b, an aligned bore 12c resulting which can receive a fastener F. In FIG. 6, such fasteners are shown as Philip-head screws. Such fasteners can be self-tapping or be provided with nuts. In FIG. 6, the assembled testing device 10 is illustrated. The testing device shown in FIG. 6 has a power line 40 that includes an automobile cigarette lighter adapter 64 for providing electrical power to the device from an automobile battery when a test device is used in an automobile. As will be discussed in connection with FIG. 7, however, the device can also be provided with its own internal power source, in which case the device can be used in other applications or where the cigarette lighter adapter is not available or non-functioning.

Figure 5:
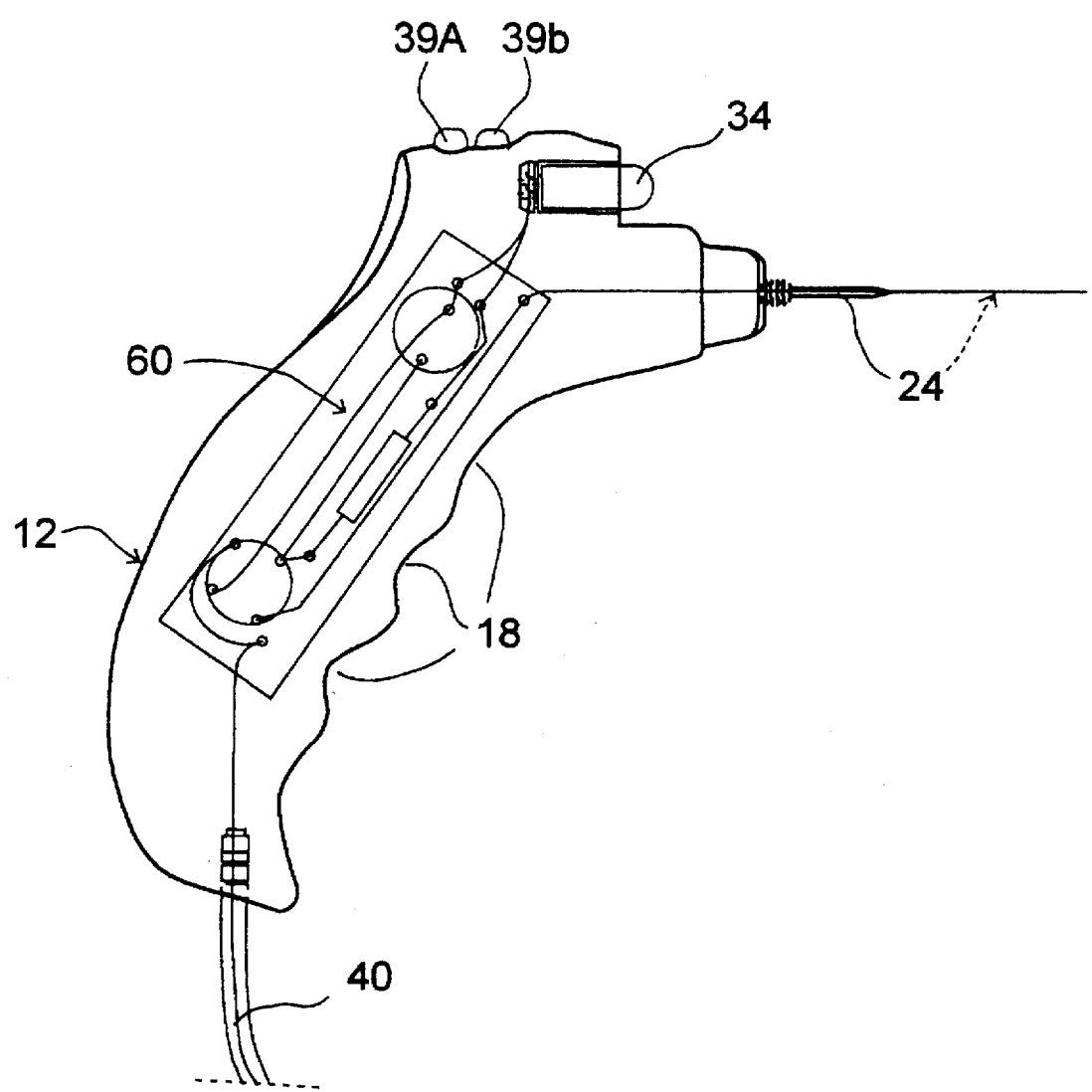
FIG. 5 is a schematic representation of the voltage probe testing device shown in FIG. 1, but also showing how the electric components that form part of the device, including two indicator LEDs, are mounted in the housing.

In FIGS. 1 and 6, a single LED 39 is shown, while two LEDs 39a and 39b are shown in FIG. 5. These are slightly different embodiments. With the one LED circuit, the LED may be a single or a double color LED. The two LED arrangement, each LED is typically a single color LED. Thus, for example, when the device is intended to be used in an automobile environment for tracing "hot" and "ground" leads, the single LED units will preferably change colors depending on the voltage potential on the lead. Thus, for example, the LED can turn red when a "hot" or 12 volt lead has been probed or turn green when the probe makes contact with a "ground" lead or conductor. In the two LED version of FIG. 5, the red LED would light when a "hot" lead is contacted by the probe, while only the green LED would light when a ground wire is contacted.

Turning to FIG. 7, the reference numeral 66 generally represents an electric circuit used in one embodiment of the voltage probe testing device connected to a source of voltage generally designated by the numeral 68 that includes a battery 70. The source of voltage 68 can either be an internal or an external one. When internal, the battery 70 must be provided within the housing 12. In accordance with the presently preferred embodiment, however, the source of voltage 68 is an external one, such as the battery 70 of a car battery. In the preferred embodiment shown in FIGS. 1–6, therefore, the source of voltage does not form part of the testing device and is not within the housing 12. Instead, the reference numeral 72 represents the positive (+) contact of a cigarette lighter on an automobile cigarette lighter, while the reference numeral 74 represents the chassis ground (−) contact also within the cigarette lighter receptacle. Accordingly, across the contact 72, 74 there appears the battery voltage $v_B$ which, for most vehicles is equal to approximately 12 volts. All of the electronics illustrated in FIG. 7 outside of the source of voltage 68 is contained within the housing 12 and, preferably, mounted on the print ed board, with the exception of the test probe 24, the lamp or bulb 34 and the LEDs.

When the cigarette lighter adapter 64 is placed in the cigarette lighter receptacle, the circuit 66 is connected to the voltage source 68 at the cigarette lighter terminals 72, 74. The lamp or bulb 34, as should be clear, immediately becomes energized and lights up since it is placed directly across the automobile battery.

A Zener diode 76 is connected to the battery by means of a current limiting resistor 78, the purpose of the Zener diode being to reduce the voltage of the battery to some intermediate level between the maximum battery voltage and the ground potential. For example, the Zener diode may be a 6 volt diode so that the voltage across the diode is dropped to 6 volts. Connected between the Zener diode 76 and the test probe 24 are two circuits in parallel to each other, the first being a series circuit of an LED 39a and a resistor 80, while the second is a series circuit of LED 39b and a resistor 82. The diodes 39a, 39b are inverted in relation to each other. It should be clear that the potential across each of the two parallel circuits, namely voltage $V_o$ will have a magnitude and polarity that will be a function of the direction of current flow through one or the other of the LED circuits. An output device 84 is connected in parallel to the diode circuits so that the voltage $V_o$ developed across these diode circuits also appears across the output device 84.

The output device 84 can be any one or a combination of a number of different devices that provide auditory and/or tactile feedback to a user. Examples of a few output devices are illustrated in FIGS. 8–10. Thus, in FIG. 8, such output device is in the form of a speaker or other sound generating transducer 86. The output device 84a may optionally include a series circuit, connected in parallel with the speaker 86, that consists of a diode 88 and a coil 90. The coil 90 may be a part of a buzzer, eccentric rotating device or other vibrating or oscillating element that imparts vibrations or some physical movements to the housing that can be felt by the user while holding the device. The purpose of a diode 88, as will be discussed, only permits actuation of the vibrating element for one polarity of the sensed voltage but not the other.

In FIG. 9, the output device 84b consists of a voltage control oscillator (VCO) the output of which is an audio signal the frequency of which is a function of the voltage applied to the VCO. The output of the VCO is connected to a loudspeaker 86 or other sound in generating device.

In FIG. 10, a further example of an output device 84c includes a voltage discriminator 94 that serves as a detector for discriminating between predetermined voltage levels. When different levels are detected, outputs are selectively applied to one of two different loudspeakers 86, 86' that can have different output audio characteristics, such as volume, pitch, etc.

When an internal power source 68 is used, the lead 40 is in the nature of a grounding lead 74' (FIG. 7) that can be connected to chassis ground of the automobile to tie the ground potentials of the internal source and the automobile to each other to provide a suitable reference point for making measurements.

Referring to FIG. 11, however, a modified embodiment is shown wherein the probe support portion 20 is pivotably mounted on the upper end 14 of the housing. Thus, the pivotably mounted portion 12e has a lower circular contour 12f, while the stationary portion 12g has an upper circular contour 12h, the two circular contours 12f, 12h together defining a circle having a center at 12i where the pivot element is mounted and about which the portion 12e can pivot relative to 12g. The specific construction to provide such pivoting action is not critical and any conventional means may be used to secure the pivotably mounted portion 12e in a predetermined or desired angular orientation ($\alpha'$), such as friction surfaces, tightening screw, spring biassing, etc. As will be appreciated, since both the test probe 24 and the lamp or bulb 34 are supported on the pivotably mounted portion 12e, the illumination 38 will follow the test probe regardless of the angle a and the probed region will continue to be illuminated at all times. This construction substantially facilitates the use of the testing device, particularly in a cramped or contained area, such as under a dashboard of a motor vehicle.

The operation of the voltage probe testing device will now be described. For purposes of the description, the presently preferred embodiment shown in FIG. 6 will be discussed. The cigarette lighter adapter 64 is placed into the cigarette lighter receptacle 72, 74 of the automobile being tested. The lamp or bulb 34 will immediately light to provide illumination in the region of the test probe 24. When the battery 70, which for purposes of the present discussion will be assumed to be equal the 12 volts, is connected to the circuit 66, 12 volts appear on the left side of the current limiting resistor 78, while the Zener diode 76 drops that voltage to 6 volts on the right side of the resistor 78. When the test probe 24 pierces insulation 96a of a wire 96 (FIG. 7) and makes contact with internal conductor 96b, the operation of the circuit 66 will depend on the potential on the conductor 96b. If the potential on the conductor 96b is 12 volts (a "hot" lead), the potential on the test probe 24 will be higher than the potential across the Zener diode 76, so that the operative voltage $V_o$ will be −6 volts. This will be cause a current $I_1$ to flow only through the LED 39a and resistor 80. When the LED 39a is selected to be a red LED, it will light up and provide an indication to the user that a "hot" lead has been contacted. However, when the probe 24 pierces a wire 96 on which a ground or "zero" potential exists, the potential in the probe will be lower than the potential causes in a diode 76. Now, the voltage $V_o$ will be +6 volts and a current $I_2$ will flow only through the LED 39b and resistor 82. Preferably, this LED 39b is selected to be a green LED so that it provides an indication to the user that a ground wire has been contacted. It will be clear to those skilled in the art that where a single LED 39 is used, the parallel circuits shown in FIG. 7 can be combined into a single LED circuit.

In view of the foregoing, it is clear that the output voltage $V_o$ can fluctuate from a positive to a negative potential, the polarity reversing itself depending on the potential applied to the probe 24.

With the output device 84, the sound generating device 86 will produce an audio signal whenever a positive or ground potential is applied to the probe 24. With the optional vibrating element arrangement shown in FIG. 8, the diode 88 only provides a tactile or vibrating feedback to the user when a "hot" lead is touched by the bulb 24, since the diode 88 only allows a current to flow through the coil 90 when a potential voltage is applied to the probe 24 which is greater than the potential across the Zener diode 76. This would normally be a voltage potential in the range of approximately 6–12 volts with the circuit 66 as shown in FIG. 7. The threshold voltage can, however, be changed by changing the value of breakdown voltage of the Zener diode 76.

With the output device of FIG. 9, the level of the electrical potential applied to probe 24 will determine the voltage applied to the VCO 92. The voltage level at the VCO 92 will determine the frequency of the output signal from the VCO and, in turn, this will determine the pitch of the audio signal emanating from the speaker 86 or other sound generating device.

It will become clear to those skilled in the art that the output device 84 can be as simple or sophisticated as may be desired. Thus, in FIG. 10, another example is shown in which two separate loudspeakers 86 and 86' can be connected to a conventional switching device that will switch one or the other of the speakers into the circuit depending on the level of the voltage and/or the polarity of the voltage applied to the detector circuit 94. Thus, for example, if a positive polarity signal is applied across a detector 94, one type of sound generating device 86 can be energized, such as electro-acoustic speaker, a piezo electric element, buzzer or the like, and a different type of sound generating device 86' is energized when a negative polarity signal is applied.

Numerous other electrical circuit designs can be used to either provide the same or different indications. thus, in FIG. 12 a circuit 100 includes an IC operational amplifier 102, a bipolar LED 104 and a diode bridge 106 to light the red LED 104a and provide a continuous buzzer sound when the test probe 24 contacts a "hot" wire, while the green LED 104b lights and the buzzer 86 sounds continuously when the test probe 24 contacts a ground wire. FIG. 13 shows a more complex circuit 110 which uses four IC operational amplifiers 112–115 and a bi-color LED 116 connected as shown to light the red LED 116a and provide a continuous buzzer sound when the test probe 24 contacts a "hot" wire. When a ground wire is contacted, the green LED 116b lights although the buzzer 86 sounds intermitently. Clearly, the more complex the desired outputs, the more complicated that the circuit must be. However, the basic objectives of the device can be achieved with the simplest of electrical circuits.

Thus, the voltage probe testing device in accordance with the present invention is ergonomically designed, preferably provides at least one other type of feedback besides visual feedback, such as auditory or sensory, and provides illumination means for illuminating the work area. This is particularly important, as suggested, when working under the dashboard of a motor vehicle where there is no light. The design allows the unit to the be plugged into the cigarette lighter receptacle and permits one-handed operation without the need for manipulating a separate flashlight, etc. The testing device is computer safe and can be used to measure any electrical circuits in the motor vehicle.

It should be understood that the foregoing description of the invention is intended merely to be illustrative thereof and that other embodiments and modifications may be apparent to those skilled in the art without departing from the spirit of the invention.

I claim:

1. Voltage probe testing device comprising a portable housing having an elongate gripping portion and an operative portion at one end of said gripping portion; an elongate test probe generally defining a probe axis and having an insulation penetrating test point at one end of said operative portion and having another end thereof mounted on said operative portion; circuit means in said housing connected to said test probe for sensing voltages applied to said test probe and for providing at least one output signal upon sensing of at least one predetermined voltage level on said test probe; indicator means oriented on said operative portion to provide a user of said device at least one visually perceptible indication in response to generation of said at least one output signal during gasping of said gripping portion by said user and indication of said at least one output signal; light generating means on said operative portion for illuminating the region of said test point of said test probe when the device is in use; said gripping portion generally being in the shape of a pistol grip that can be held in the palm of said user said gripping portion having a plurality of indentations thereon, each said indentation individually sized and dimensioned for a finger of said user's hand providing said user a secure gasp of said gripping portion and generally defining a grip axis offset from said probe axis, said test probe being mounted and oriented on said operative portion to point in a direction generally away from the user when normally gripped; whereby said gripping portion of the device is gripped and held within the palm of said user without interfering with the access and visibility of said test point, indicator means and light generating means.

2. Voltage testing device as defined in claim 1, wherein said probe and grip axes define an angle of at least 90°.

3. Voltage testing device as defined in claim 2, wherein said angle is equal to approximately 120°.

4. Voltage testing device as defined in claim 1, wherein said light generating means defines an optical axis generally parallel to said probe axis.

5. Voltage testing device as defined in claim 1, wherein said circuit means includes input power line means which includes an automobile cigarette lighter adapter for providing electrical power to said circuit means from an automobile battery when the test device is used in an automobile.

6. Voltage testing device as defined in claim 1, wherein said indicator means comprises an LED.

7. Voltage testing device as defined in claim 1, wherein said indicator means comprises a sound generating device.

8. The voltage testing device as defined in claim 1, wherein said circuit means can sense two predetermined voltage levels on said test probe, and said indicator means comprises two separate LED's disposed on said operative portion of said device and visually unobstructed by said housing or a user's hand when said user's hand grasps said gripping portion and each responsive to another one or the output signals corresponding to each or said voltage levels.

9. Voltage testing device as defined in claim 1, wherein said circuit means can sense two predetermined voltage levels on said test probe, and said indicator means comprises two separate sound generating devices each responsive to another one of the output signals corresponding to each of said voltage levels.

10. Voltage test device as defined in claim 1, wherein said circuit means can sense two predetermined voltage levels on said test probe, and wherein said circuit means includes a voltage controlled oscillator which generates a signal that has a frequency which is a function of the level of an input signal, said indicator means comprising a sound generating device connected to said voltage controlled oscillator to produce an audio output indication which is different for each predetermined voltage level applied to said test probe.

11. Voltage testing device as defined in claim 1, wherein said circuit means includes internal voltage supply means, and further comprising a grounding conductor for placing the grounds of said circuit means and a device to be tested at the same potential level.

12. The voltage testing device as defined in claim 1, wherein said operative portion fixedly supports said test probe, and said operative portion is pivotally mounted with respect to said gripping portion enabling the user to selectively adjust the angle defined between said probe and grip axes.

13. Voltage testing device as defined in claim 1, in which said circuit means is mounted within said gripping portion substantially parallel to said gripping portion axis for providing ease of electrical connection to said circuit means.

14. Voltage probe testing device comprising a portable housing having an elongate gripping portion and an operative portion at one end of said gripping portion; an elongate test probe generally defining a probe axis and having an insulation penetrating test point at one end thereof and having another end thereof mounted on said operative portion; circuit means in said housing connected to said test probe for sensing voltages applied to said test probe and for providing at least one output signal upon sensing of at least one predetermined voltage level on said test probe; indicator means oriented on said operative portion for providing at least one visually perceptible indication in response to generation of said at least one output signal during grasping of said gripping portion by said user and indication of said at least one output signal; said gripping portion generally being in the shape of a pistol grip that can be held in the palm of a user and generally defining a grip axis offset from said probe axis, said test probe being non-pivotally mounted and oriented on said operative portion to point in a direction generally away from the user when normally gripped, and said gripping and operative portions being pivotally connected to each other to permit selective adjustment of the angle between said probe and grip axes.

15. Voltage testing device as defined in claim 14, in which said circuit means is mounted within said gripping portion substantially parallel to said gripping portion axis for providing ease of electrical connection to said circuit means.

* * * * *

UNITED STATES PATENT AND TRADEMARK OFFICE
CERTIFICATE OF CORRECTION

PATENT NO.  : 5,672,964
DATED       : September 30, 1997
INVENTOR(S) : Peter Vinci It is certified that error appears in the above-identified patent and that said Letters Patent is hereby corrected as shown below:

Column 9, line 49, please replace the word "gasping" with the word --grasping--.

Column 9, line 54, please replace "user" with --user,--.

Column 9, line 58, please replace the word "gasp" with the word --grasp--.

Column 10, line 22, please replace the word "or" with the word --of--.

Signed and Sealed this

Third Day of March, 1998

Attest:

BRUCE LEHMAN

Attesting Officer

Commissioner of Patents and Trademarks